United States Patent [19]

Bou et al.

[11] Patent Number: 5,360,485
[45] Date of Patent: Nov. 1, 1994

[54] APPARATUS FOR DIAMOND DEPOSITION BY MICROWAVE PLASMA-ASSISTED CVPD

[75] Inventors: Pierre Bou, Orléans la Source; Lionel Vandenbulcke, Saint Jean Le Blanc; Alain Quilgars, Jouy le Potier; Michel Coulon, Montmorency, all of France; Michel Moisan, Québec, Canada

[73] Assignee: Pechiney Recherche, Courbevoie, France

[21] Appl. No.: 911,693

[22] Filed: Jul. 10, 1992

[30] Foreign Application Priority Data

Jul. 12, 1991 [FR] France ................... 91 09552

[51] Int. Cl.[5] ........................... C23C 16/50
[52] U.S. Cl. ................... 118/723 ME; 118/725; 118/730
[58] Field of Search ...... 118/723, 725, 730, 723 MW, 118/723 ME, 723 MR, 723 MA; 156/345, DIG. 68

[56] References Cited

U.S. PATENT DOCUMENTS

| | | | |
|---|---|---|---|
| 4,438,368 | 3/1984 | Abe et al. | 118/723 X |
| 4,989,542 | 2/1991 | Kamo | 118/723 |
| 5,132,105 | 7/1992 | Remo | 156/DIG. 68 X |
| 5,188,862 | 2/1993 | Itatani et al. | 156/DIG. 68 X |

FOREIGN PATENT DOCUMENTS

| | | |
|---|---|---|
| 145346 | 6/1985 | European Pat. Off. |
| 2575151 | 6/1986 | France |
| 57-133623 | 11/1982 | Japan |
| 59-171136 | 1/1985 | Japan |
| 60-231498 | 11/1985 | Japan |

OTHER PUBLICATIONS

Paquin et al, "Amorphors Silicon for Photovoltaics Produced by New Microwave Plasma-Deposition Techniques", Can. J. Phys. vol. 63, 1985, pp. 831-837.
Joeris et al, "Deposition Experiments With Separated Atomic Hydrogen and CH4 Sources", *Diamond and Diamond-Like Films and Coatings*, pp. 549-554 (Jan. 1992).
Catherine, "Preparation Techniques for Diamond-Like Carbon", *Diamond and Diamond-Like Films and Coatings*, pp. 193-227 (Jan. 1992).
J. Phys. E: Sci. Instrum. 20 (1987), "The Waveguide Surfatron: a High Power . . . Columns", Moisan et al, pp. 1356-1361.
Applied Physics Letters, vol. 23, Dec. 5, 1988, "Spiral Hollow Cathode Plasma-Assisted Diamond Deposition", Tzeng et al, pp. 2326-2327.

*Primary Examiner*—R. Bruce Breneman
*Assistant Examiner*—Jonathan D. Baskin
*Attorney, Agent, or Firm*—Dennison, Meserole, Pollack & Scheiner

[57] ABSTRACT

Apparatus for depositing diamond on a substrate assisted by microwave plasma, comprising two zones, a plasma formation zone located in a waveguide and a diamond deposition zone located outside the waveguide. The apparatus includes means making it possible to form a stable plasma in the deposition zone, so as to considerably increase the substrate surface which can be treated.

18 Claims, 6 Drawing Sheets

APPARATUS FOR DIAMOND DEPOSITION BY MICROWAVE PLASMA-ASSISTED CVPD

FIELD OF THE INVENTION

The invention relates to an apparatus and to a process for the deposition of diamond on a substrate by CVPD (chemical vapour phase deposition) assisted by a microwave plasma.

DESCRIPTION OF RELATED ART

Numerous documents are already known, which relate to the synthesis of the diamond under low pressure using a hydrocarbon gas. In all cases, the principle of the low pressure synthesis process is based on the dissociation of the carbon carrier gas, in the presence of a selective etchant of the graphite (an etchant being an agent which reacts with a solid, in this case graphite, and which returns it to the vapour phase) such as a high atomic hydrogen pressure, which can be obtained with the aid of various means such as an oxyacetylene torch, or a cold plasma using radio-frequencies or microwaves.

There are also various apparatuses and processes combining several basic processes. Thus, European Patent 272,418 describes a low pressure synthesis process, in which the plasma is formed in a chamber, placed in a microwave cavity, in which a filament is raised to a high temperature. The substrate on which the diamond is deposited is located in said chamber.

The cold plasma low pressure processes and apparatuses and in particular those involving the formation of the cold plasma by microwaves are particularly interesting, in view of the relatively "gentle" experimental conditions used. However, all these processes have an important limitation in practice, which is the volume of the deposition chamber or the useful deposition surface. These geometrical limitations (dimensions of the resonant cavities or waveguides) in part result from the undulating nature of microwaves, the associated wavelengths (12.24 cm for a frequency of 2.45 GHz) and the physics of plasmas.

SUMMARY OF THE INVENTION

The object of the invention is an apparatus and process for the deposition of diamond on a substrate to be coated by microwave plasma-assisted CVPD, making it possible to considerably increase the substrate surface to be treated, typically multiplying it by 6.

The invention therefore relates to apparatus for the deposition of diamond on a substrate assisted by a microwave plasma and having a deposition chamber, whereof one portion is placed in a waveguide supplied by a microwave generator and which is equipped with a device for eliminating the power reflected towards said generator, said chamber containing a substrate to be treated placed on a support, means for heating the substrate, means for bringing about a flow in said chamber and under a low, regulated pressure of a plasma forming gas and a reactive gaseous mixture constituted by hydrogen and carbon-carrying gas, characterized in that, so as to obtain a stable plasma in a large volume and/or on a large surface:

a) the deposition chamber comprises two connected zones, one small volume zone being the so-called plasma formation zone located within the volume defined by the waveguide and the other larger volume/surface zone being the so-called diamond deposition zone located outside the volume defined by the waveguide and containing the substrate to be treated, b) the waveguide is provided with means making it possible to form a stable plasma in the deposition zone located outside the volume defined by the waveguide and containing the substrate to be treated.

BRIEF DESCRIPTION OF THE DRAWINGS

FIGS. 6a to 6c illustrate a flattened diamond deposition zone, in which:

DESCRIPTION OF THE PREFERRED EMBODIMENTS

The Applicant has investigated means for increasing the plasma propagation zone. The Applicant found that apparatuses known as the "surfaguide", "surfatron" and "waveguide surfatron or WS" were of interest in connection with the present invention, the preferred apparatus being the WS. The WS is described in a publication by M. Moisan et al, published in J. Phys. E:Sci. Instrum. 20, 1987, pp. 1356–1361.

Figure 1:
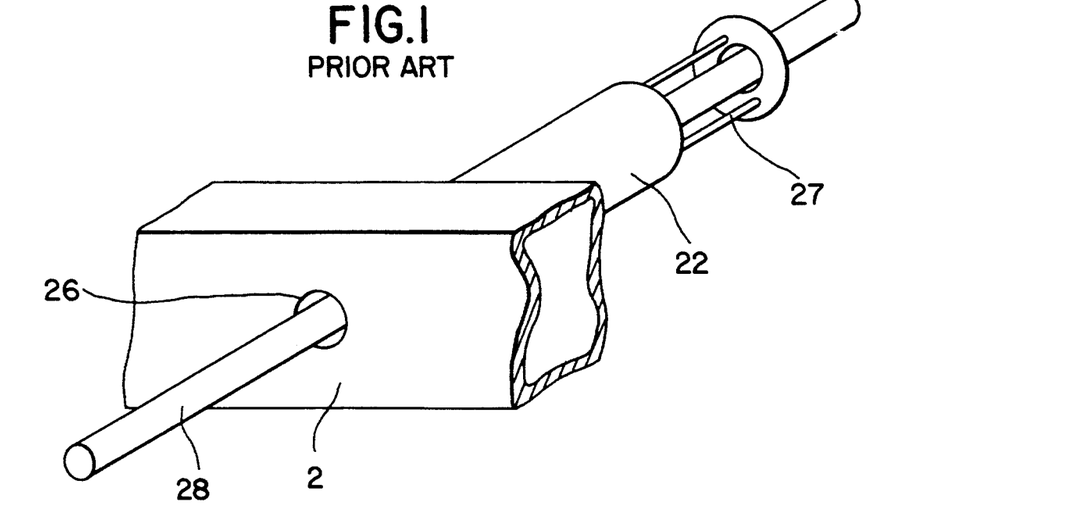
FIG. 1 is a perspective view of a prior art waveguide surfatron (WS) showing the relative arrangement of the waveguide (2), the coaxial line (tube 22 and piston 27) and the tube (28) containing the plasma.
Figure 2:
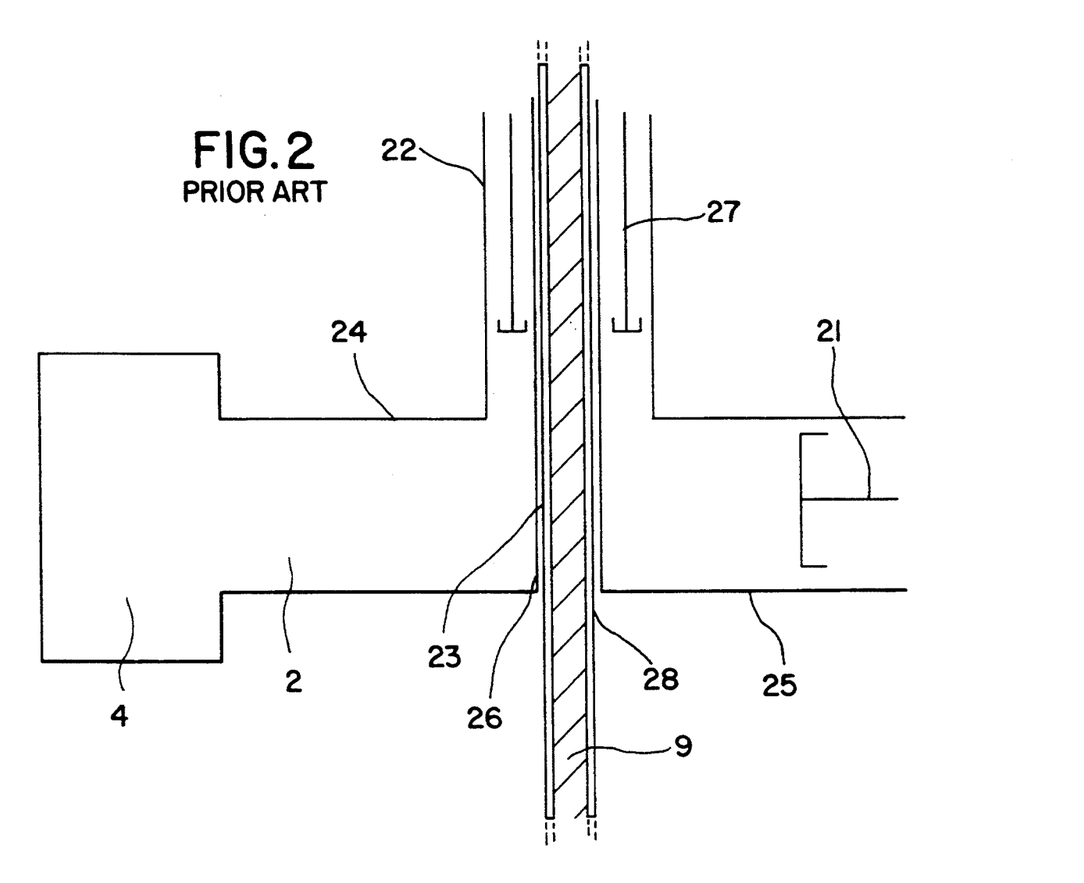
FIG. 2 is a sectional view of the WS of FIG. 1, indicating the main components.

FIGS. 1 and 2 show the structure of the waveguide surfatron disclosed in the Moisan et al article, including a waveguide (2), typically a tube having a rectangular cross-section and which is supplied with microwave energy from a microwave generator (magnetron) and which is terminated by a waveguide piston (21) making it possible to adjust the electromagnetic path of the wave, as well as a coaxial line perpendicular to the waveguide (2) and comprising two coaxial metal tubes, namely an external tube (22) connected to a wall (24) of the waveguide and an internal, coaxial tube (23) introduced into the waveguide (2) up to a wall (25) parallel to the first-mentioned wall (24), so as to leave a circular gap (26) permitting the passage of electromagnetic waves. Between the two coaxial tubes (22,23), a coaxial piston (27) makes it possible to adjust the electromagnetic path of the wave.

When a tube (28), made from a dielectric, and typically quartz is placed within the inner tube (23) and traverses the waveguide and the coaxial line perpendicular thereto, the operating WS produces in the circular gap (26) an exciting electric field parallel to the axis of the tube (28), which makes it possible to simultaneously ionize gases contained in the tube and therefore form a plasma (9) and propagate surface waves, so that the plasma column (9) extends up to the location where the energy transported by the wave is no longer adequate to create an electron density exceeding the cutoff density of the discharge. Therefore a plasma column (9) can be maintained stably in a quartz or glass tube outside the waveguide and coaxial line and solely surrounded by ambient air.

The Applicant has studied the possibilities offered by the WS for achieving the objectives of the invention and has developed an apparatus for forming, by CPVD, diamond on a large substrate surface.

According to the invention, the WS has a high power microwave generator, which is typically at least 5 kW and which operates at a frequency of 2.45 GHz, which corresponds to a frequency of existing standard generators. However, the invention can be performed at other frequencies, typically between 0.05 and 10 GHz.

Figure 4:
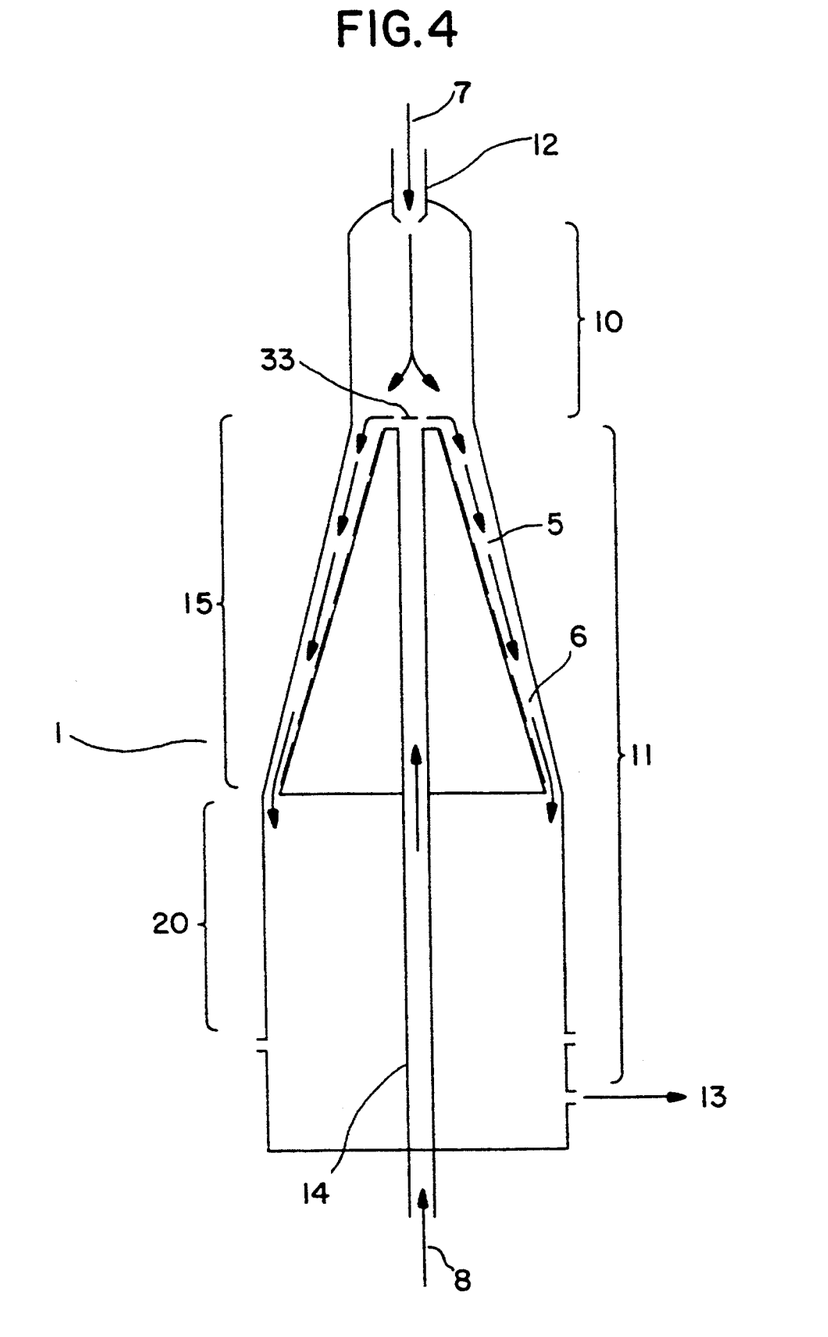
FIG. 4 is a diagrammatic view (longitudinal cross-section) of a deposition chamber (1) according to the invention with its different areas and the various gaseous flows passing through it, illustrating a truncated cone-shaped support (6)

The apparatus according to the invention, as shown in FIG. 4, associates the WS with a deposition chamber (1), usually having a cylindrical symmetry and whose so-called diamond deposition zone (11) advantageously comprises a truncated cone-shaped wall part (15), which has a maximum diameter able to exceed twice that of the plasma formation zone (10).

This truncated cone-shaped wall part is the active part for diamond deposition. The three-dimensional plasma occupies there all the reactive space between the truncated cone-shaped support (6) and the truncated cone-shaped wall (15) of the deposition zone (11). Therefore in this case the said reactive space is shaped like a truncated cone-shaped ring.

The truncated cone-shaped wall part is extended by a cylindrical wall part (20) terminated by a bottom (29), to which are connected the equipment necessary for the operation of said apparatus, particularly the means for pumping (13), measuring (16) and regulating (17) the pressure in the deposition chamber (1).

Figure 4A:
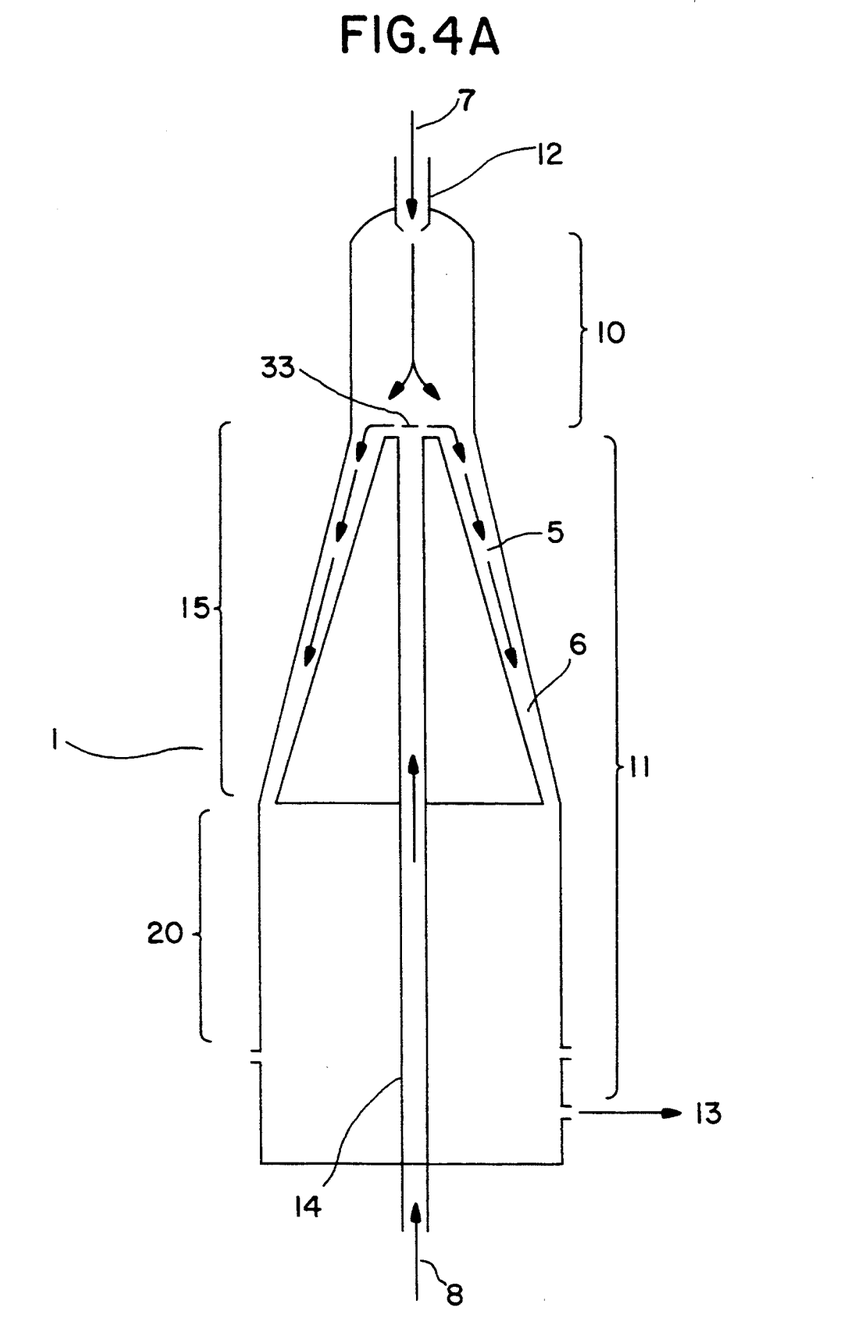
FIG. 4a is a variant of FIG. 4.

According to the invention the angle at the apex of the truncated cone-shaped support (6) can be less acute than the angle at the apex of the truncated cone-shaped wall (15), as shown in FIG. 4a, so as to reduce the reactive space (distance between the wall (15) and the support (6)) and thus compensate the reactive gas depletion and plasma heterogeneity phenomena in the longitudinal direction of the reactive space.

In the apparatus according to the invention, it is advantageous that the plasma forming gas flow (7) passes through the entire deposition chamber by means of an injector (12) located at one end of the deposition chamber (1) and by pumping means (13) located at the other end. More specifically, the injector is positioned at one end of the so-called plasma formation zone (10), whereas the pumping means are positioned at the end of the so-called diamond deposition zone (11).

According to the invention, it is also advantageous to introduce the reactive gaseous mixture (8) into the deposition chamber (1) at the limit of the zones (10) and (11) with the aid of a central supply (14) traversing the zone (11) and optionally provided with a deflector (33) producing a radial flow, so that the flow of reactive gaseous mixture (8) and plasma forming gas (7) mixes to form a single homogeneous gaseous flow travelling parallel to the wall (15) of the diamond deposition zone (11) as a result of the pumping means (13).

Figure 5A:
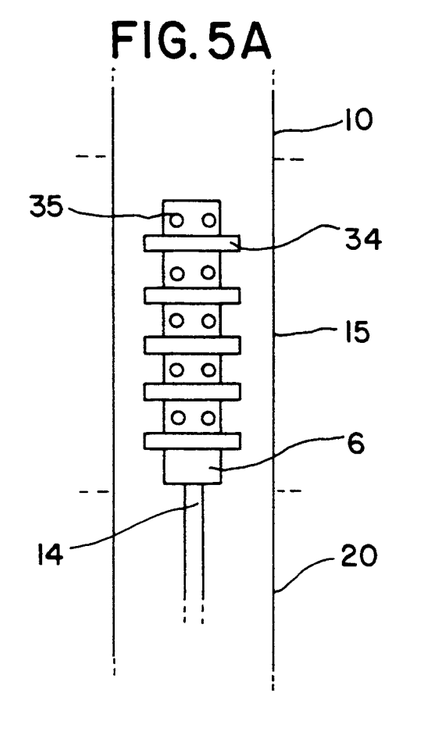
FIG. 5a to 5c are diagrammatically and in longitudinal cross-section different types of walls defining the deposition zone in the case of cylindrical supports (6) and namely a cylindrical wall having a diameter equal to (FIG. 5a) or greater than FIG. 5b) that of the cylindrical wall corresponding to the plasma formation zone (10), a truncated cone-shaped wall (FIG. 5c), so as to compensate the reactive gas depletion phenomena. The drawings show joints (34) located on a support (6) provided with orifices (35) permitting a flow of reactive gases between each joint (34)
Figure 5B:
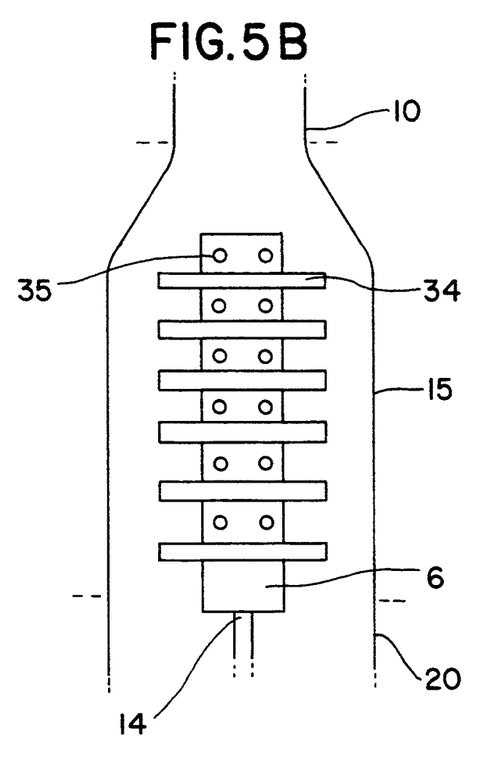
Figure 5C:
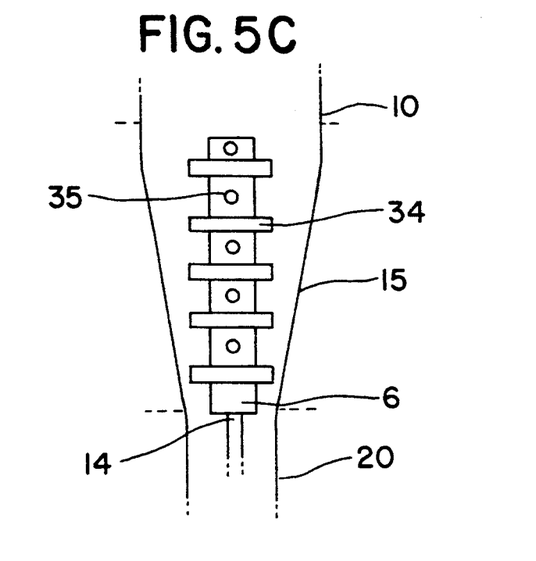

In a variant of the apparatus according to the invention shown in FIGS. 5a–5c, the reactive gaseous mixture (8) is distributed over the entire height of the diamond deposition zone (11), so as to have a substantially homogeneous reactive gaseous mixture (8) in the entire reactive space (space between the wall (15) and the support (6)). For this purpose, the central supply (14) is provided with several orifices (35) issuing at different points of the reactive space.

According to another variant of the invention (not shown in the drawings), the flow direction of the reactive gaseous mixture is reversed. The reactive gaseous mixture (8) is introduced into the deposition zone (11) and leaves it flowing through the central tube (14) and/or the orifices (35) connected in this case to the pumping device (13).

According to the invention, the wall of the deposition chamber (1) in contact with the plasma is preferably in one piece, which is usually but not exclusively of axial symmetry and which is made from quartz, silica or any dielectric material. This wall typically comprises a cylindrical wall including the plasma formation zone (10) connected to a truncated cone-shaped wall (15) including the diamond deposition zone (11).

According to the invention, the deposition chamber (1) and in particular the wall (15) including the diamond deposition zone (11) can have different geometrical characteristics from those referred to hereinbefore and which are adapted to the dimensions of the substrates (5) to be treated.

Thus, the treatment of the mechanical joints (34), typically O-rings, can advantageously be carried out in a deposition zone (11) defined by a cylindrical wall having a diameter equal to (FIG. 5a) or greater than (FIG. 5b) that of the cylindrical wall corresponding to the plasma formation zone (10). In the first case, joints having a diameter close to 55 mm can be treated, whereas in the second case joints having a diameter exceeding 55 mm can be treated according to the invention.

Moreover, in the case of a cylindrical support (6), it can be advantageous to limit all or part of the deposition zone (11) by a truncated cone-shaped wall, as shown in FIG. 5c, which is oriented so as to compensate the decrease of the electron density during the increase of the distance between the substrate (5) to be treated and the plasma formation zone (10) by reducing the reactive space and in this way bringing about a homogeneous diamond deposition on all the substrates.

Figure 6A:
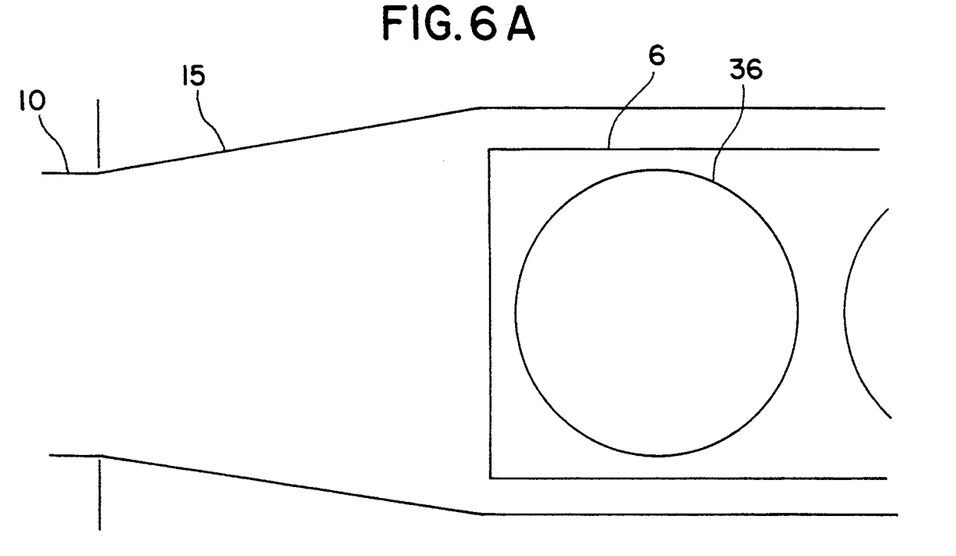
FIG. 6a is a longitudinal front view.
Figure 6B:
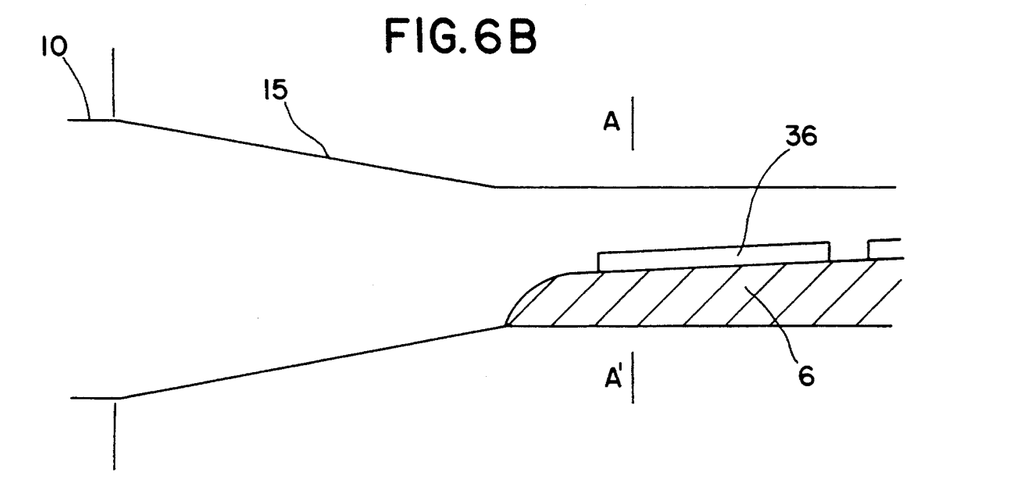
FIG. 6b is a longitudinal profile view (section)
Figure 6C:
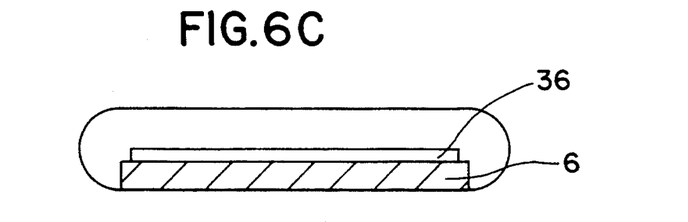
FIG. 6c is a transverse view (section) along plane AA' of FIG. 6b, where the planar substrates are disks (36) placed on the support (6).

According to another feature of the invention, the wall (15) including the diamond deposition zone (11) can have a flattened shape, as shown in FIGS. 6a to 6c, so as to be able to treat large diameter, planar substrates (36), typically having diameters close to 10 cm and which are e.g. to be used in the electronics industry.

No matter what the shape of the diamond deposition zone (11), it is possible to adapt the wall (15) and/or the support (6) so as to have a progressive decrease in the distance between the wall (15) and the support (6) (as illustrated by FIG. 4), so as to compensate she reactive gaseous mixture depletion phenomena (8).

EXAMPLE 1

Figure 3:
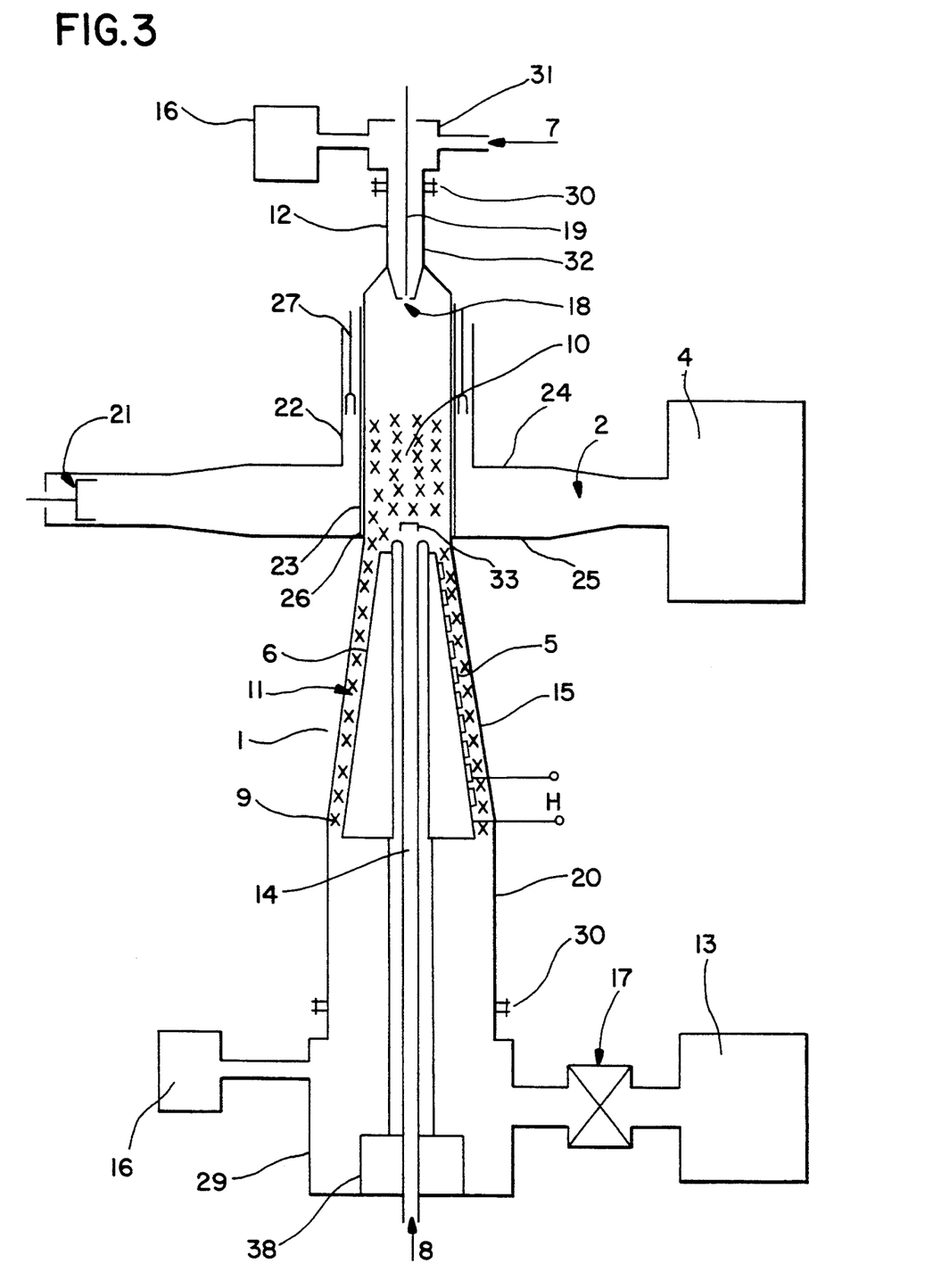
FIG. 3 is a sectional view of a typical apparatus according to the invention.

The apparatus according to the invention will be better understood relative to a non-limitative embodiment shown in FIG. 3. In this embodiment, the WS used is equipped with a magnetron, which emits an electromagnetic wave at a frequency of 2.45 GHz and with a power of 6 kW. Its internal metal tube (23) has an internal diameter of 80 mm. Its external tube (22) is cooled with water. Pistons (21) and (27) make it possible to optimize the coupling with the plasma correlated with a minimizing of the power reflected at the magnetron, so as not to damage it and use most of the power supplied for forming and maintaining the plasma.

The deposition chamber (1) used comprises a quartz upper cylindrical wall corresponding to the plasma formation zone (10) closing at its end on the wall of an injector (12) of a plasma forming gas (7). The cylindrical wall has an external diameter slightly smaller than 80 mm, so as to allow it to be easily slid into the inner tube (23) of the WS.

The deposition chamber (1) also comprises an injector (12) having a tapered quartz tube (32) with a diameter of 35 mm, welded to the 80 mm diameter cylindrical wall, whose orifice 18 has a diameter of 0.7 mm, as well as a stainless steel enclosure (31) tightly connected to the tapered tube (32) by means of an O-ring (30). The stainless steel enclosure (31) has a plasma forming gas intake (7), a pressure gauge (16) and a means for positioning the needle valve (16) and controlling its height so as to ensure a plasma forming gas ejection rate sufficient to move the plasma away from the orifice (18), no matter what the flow rate of the plasma forming gas (7).

The deposition chamber (1) also has a truncated cone-shaped quartz wall (15) corresponding to the active part of the deposition zone (11), having a height of 300 mm and extended by a diameter 160 mm, quartz cylindrical wall (20).

All the quartz walls of the deposition chamber are preferably made from a single one-piece quartz member.

The chamber (1) also has a stainless steel bottom (29) tightly connected to the cylindrical wall (20) by O-rings (30). The bottom is provided with a gauge (16), as well as means for pumping (13) and controlling the pressure (17). It is also equipped with a means (38) permitting the positioning of the support (6), the arrival of reactive gases (8) by the pipe (14) optionally provided with a deflector (33) at its end and the rotation of the support (6) during the deposition phase, so as to obtain a homogeneous deposit. The truncated cone-shaped support is made from silica, having a small diameter of 44 mm, a large diameter of 125 mm and a height of 280 mm. On said support, the substrate is in the form of 150 thin disks for cemented carbide cutting tools, each having a surface of approximately 1 cm².

The chamber (1) also has heating means, shown schematically as a connection H to the support (6), making it possible to heat the support and bring the substrate (5) to a temperature of up to 1000° C.

In FIG. 3, crosses indicate the space occupied by the plasma (9) within the deposition chamber. The plasma is maintained in the cavity (10) and in the reactive space externally defined by the truncated cone-shaped wall (15). This plasma confinement also results from the fact that the plasma forming gas is always injected into the deposition chamber at a high speed through the orifice (18), which prevents the plasma from rising in the injector (12).

The second object of the invention is a process for the deposition of diamond by microwave-assisted CPVD using the apparatus according to the invention. In this process, the same performance parameters are considered as those which are already known and this applies with regards to the nature of the plasma forming gases, the gaseous compositions aiding nucleation and the growth of diamond crystals rather than the formation of graphite, the choice of the carbon-carrying gases, treatment temperatures generally between 800° and 1100° C. and often close to 1000° C., etc.

With regards to the substrate (5), the process according to the invention makes it possible to treat either a large number of substrates of all types deposited on a support, or, bearing in mind the increase in the volume of the deposition chamber, to treat whole parts, which can have a truncated cone-shape, e.g. radomes and irdomes for the aeronautical or space industries.

EMBODIMENT 2

After producing a primary vacuum in the deposition chamber (1), including the injector (12), into the injector (12) argon is introduced as the plasma forming gas (7), at a flow rate of 2.8 l/min., so as to carry out argon scavenging under a pressure of 666 Pa (5 Torr). After said scavenging, the microwave generator (4) is started up and a plasma is formed within the deposition chamber. The generator (4) is raised to the maximum power of 6 kW, whilst optimizing the coupling with the plasma, using the pistons (21) and (27). The reflected power is still virtually zero, even with a power level of 6 kW.

Hydrogen is then introduced by the pipe (14) at a rate of 0.6 l/min. and the temperature of the substrates (5) is then raised to an intermediate temperature of approximately 750° C. and then approximately 930° C.

Then, once again using the pipe (14), methane is introduced at a rate of 18 cm³/min and with a view to aiding the speed of nucleation and growth of the diamond relative to that of the graphite, oxygen is introduced into the argon at a flow rate of 6 cm³/min. Diamond deposition is continued for 10 h, whilst maintaining the same parameters:

| Substrate temperature | 930° C. |
| --- | --- |
| Plasma forming gas flow rates | |
| argon | 2.8 l/min. |
| oxygen | 6 cm³/min. |
| Reactive gas flow rates | |
| hydrogen | 0.6 l/min. |
| methane | 18 cm³/min. |

At the end, the oxygen, methane and hydrogen flows are stopped, followed by the microwave generator, the argon flow and finally the heating means. After returning air to the deposition chamber, the substrate is removed by disengaging the bottom (29) from the cylindrical wall (20). A 10 μm diamond deposition was obtained on 150 disks for cutting tools constituting the substrate.

Other tests were carried out modifying the gaseous compositions of the plasma forming gas (7) and the reactive gaseous mixture (8), but using in all cases a plasma forming gas (7) containing argon and a reactive gaseous mixture (8) containing hydrogen.

In particular, it is possible on the one hand to introduce the oxygen element into the plasma forming gas (7) and/or into the reactive mixture (8) and on the other introduce it either in the form of molecular oxygen $O_2$, or in combined form ($CO$, $CO_2$, $H_2O$, etc. ... ). It should be noted that $CO$ or $CO_2$ can be used according to the invention as molecules simultaneously carrying oxygen and carbon elements.

The invention makes it possible to considerably extend the possibilities of diamond deposition by microwave-assisted CVPD. Thus, the deposition surface accessible according to the prior art was typically approximately 80 $cm^2$, whereas the invention gives access to surfaces of a few hundred $cm^2$, i.e. a treatment capacity considerably increased compared with the prior art (typically by 200 to 400 $cm^2$).

However, of even greater importance is the fact that it is the first stage of a new procedure based on the idea of "removing" the plasma from the limited volume of the prior art and which offers numerous possibilities, such as e.g. diamond deposition on large surface-area parts. Thus, it will be possible to increase the power of microwave generators and therefore the deposition surface, because said generated power can be extended into a large volume and can be dissipated in a large volume/surface plasma, whereas a power increase "with constant volume" according to the prior art immediately leads to a destruction of equipment.

According to the invention, it is possible to modify and adapt the profile of the wall (15) of the deposition zone to the profile of the substrate, particularly when the latter is in one piece and which can have a specific profile, e.g. in the shape of a nose cone, i.e. moving away slightly from a strictly truncated cone-shape, so as to have a gap between the wall (15) and the substrate (6) permitting a regular diamond deposition.

In certain applications, surface diamond deposits constitute a coating of considerable hardness and therefore an effective protective coating making it possible to increase the durability of the treated parts:

radome and irdome (part identical to the radome, but for infrared radiation), shielding windows for infrared light, various sensors forming part of the "on-board electronics" of the aeronautical and space industries (stations, rockets, missiles, etc.);

sintered tungsten carbide inserts for cutting purposes;

mechanical joints for dynamic sealing;

use of thermal conductivity in heat drains for electronics and optoelectronics.

What is claimed is:

1. Apparatus for deposition of diamond on a substrate by microwave plasma assisted chemical vapor phase deposition, comprising:

a waveguide of defined volume adapted for supply by a microwave generator and including means for formation of a stable plasma outside of the volume of the waveguide, and means for eliminating reflection of power toward the microwave generator;

a deposition chamber comprising an outer wall surrounding two interconnected zones, a plasma formation zone passing through the waveguide, and a diamond deposition zone located outside of the waveguide and containing a support having a surface for holding the substrate during deposition, said outer wall and said surface being generally parallel and defining therebetween a plasma flow space;

means for heating the substrate;

means for maintaining a regulated, reduced pressure in the deposition chamber;

means for introducing a plasma forming gas into the deposition chamber; and means for introducing a reactive gaseous mixture into the deposition chamber;

said means for maintaining, means for introducing a plasma forming gas and means for introducing a reactive gaseous mixture cooperating to cause a flow of reactive gaseous mixture in the plasma flow space generally tangential to the surface.

2. Apparatus according to claim 1, wherein said means for formation of a stable plasma is a waveguide surfatron.

3. Apparatus according to claim 2, including a microwave generator (4) having a high power level of at least 5 kW.

4. Apparatus according to claim 3, wherein the microwave generator (4) operates at a frequency in the range 0.05 to 10 GHz.

5. Apparatus according to claim 1, 2, or 3, wherein the diamond deposition zone (11) comprises an active part for the deposition of diamond and which has a truncated cone-shaped wall (15) having large and small diameters connected, at the small diameter, to the plasma formation zone (10).

6. Apparatus according to claim 5, wherein the large diameter of the truncated cone-shaped wall (15) is at least 1.5 times larger than its small diameter.

7. Apparatus according to claim 5, wherein the active part for the deposition of the diamond and having a truncated cone-shaped wall (15) containing a support (6) or a one-piece substrate having a substantially truncated cone-shape, so as to have, in a reactive space between the truncated cone-shaped wall (15) and the substrate (5), a substantially homogeneous plasma so as to obtain a regular diamond thickness on the substrate.

8. Apparatus according to claim 7, wherein the truncated cone-shaped wall (15) and the support (6) are adapted so as to have a progressive reduction in the distance between the wall (15) and the support (6) sufficient to compensate a phenomena of reactive gaseous mixture depletion.

9. Apparatus according to claim 1, 2, or 3, wherein said diamond deposition zone (11) comprises an active part for diamond deposition and having a cylindrical wall (15) connected to said plasma formation zone (10).

10. Apparatus according to claim 1, 2, or 3, wherein said diamond deposition zone (11) comprises an active part for diamond deposition having a flattened wall (15) connected to said plasma formation zone (10).

11. Apparatus according to claim 1, 2, or 3, wherein the support (6) in contact with the plasma has a surface area which exceeds 300 $cm^2$.

12. Apparatus according to claim 1, 2, or 3, including a plasma forming gas injector (12) located at one end of said chamber upstream of the plasma formation zone and a means for pumping gaseous atmosphere in said chamber located at the other end.

13. Apparatus according to claim 12, wherein the injector (12) is provided with means ensuring a high intake speed of the plasma forming flow into the said chamber (1), so as to move the plasma away from the injector.

14. Apparatus according to claim 1, 2, or 3, wherein the reactive gaseous mixture (8) is introduced into the deposition chamber (1) with a central supply means (14) traversing said diamond deposition zone (11) and having an outlet at the interconnection of said plasma formation and diamond deposition zones.

15. Apparatus according to claim 14, wherein said outlet is provided with a deflector (33) producing a radial flow of the reactive gaseous mixture (8), so as to produce a substantially homogenous gaseous atmosphere in the deposition zone.

16. Apparatus according to claim 1, 2, or 3, wherein the reactive gaseous mixture (8) is introduced into the deposition chamber (1) with a central supply means (14), traversing said diamond deposition zone (11) and provided with several orifices issuing at different points in a reactive space in said diamond deposition zone.

17. Apparatus according to claim 16, wherein said central supply means (14) is connected to a pumping device (13) for evacuating the reactive gaseous mixture from the deposition zone.

18. Apparatus according to claim 1, 2, or 3, wherein the deposition chamber (1) is provided with means for rotation of the support (6), so as to obtain a homogeneous deposit.

* * * * *